US009478606B2

(12) United States Patent
Sdrulla et al.

(10) Patent No.: US 9,478,606 B2
(45) Date of Patent: Oct. 25, 2016

(54) SIC TRANSIENT VOLTAGE SUPPRESSOR

(71) Applicant: MICROSEMI CORPORATION, Bend, OR (US)

(72) Inventors: Dumitru Sdrulla, Bend, OR (US); Bruce Odekirk, Bend, OR (US); Cecil Kent Walters, Scottsdale, AZ (US)

(73) Assignee: Microsemi Corporation, Bend, OR (US)

( * ) Notice: Subject to any disclaimer, the term of this patent is extended or adjusted under 35 U.S.C. 154(b) by 0 days.

(21) Appl. No.: 14/622,309

(22) Filed: Feb. 13, 2015

(65) Prior Publication Data

US 2016/0126306 A1    May 5, 2016

Related U.S. Application Data

(60) Provisional application No. 61/939,286, filed on Feb. 13, 2014.

(51) Int. Cl.
| H01L 31/0312 | (2006.01) |
| H01L 29/06 | (2006.01) |
| H01L 29/872 | (2006.01) |
| H01L 29/16 | (2006.01) |
| H01L 29/36 | (2006.01) |
| H01L 29/861 | (2006.01) |
| H01L 29/66 | (2006.01) |

(52) U.S. Cl.
CPC ........ H01L 29/0626 (2013.01); H01L 29/0619 (2013.01); H01L 29/1608 (2013.01); H01L 29/36 (2013.01); H01L 29/872 (2013.01); H01L 29/6603 (2013.01); H01L 29/861 (2013.01); H01L 29/8618 (2013.01)

(58) Field of Classification Search
CPC ............. H01L 29/0626; H01L 29/872; H01L 29/1608; H01L 29/36; H01L 29/0619
USPC .......................................................... 257/77
See application file for complete search history.

(56) References Cited

U.S. PATENT DOCUMENTS

| 7,851,881 | B1 | 12/2010 | Zhao et al. |
| 8,445,917 | B2 | 5/2013 | Haney et al. |
| 8,841,718 | B2 | 9/2014 | Sdrulla et al. |
| 2014/0266403 | A1* | 9/2014 | Das ...................... H01L 29/872 327/493 |

OTHER PUBLICATIONS

Kashyap, Avinash S., et al., "Silicon Carbide Transient Voltage suppressor for Next Generation Lightning Protection," Wide Bandgap Power Devices and Applications, 2014 IEEE Workshop, Knoxville, Tennessee, Oct. 13-15, 2014, pp. 147-150.

(Continued)

Primary Examiner — Thanh T Nguyen
(74) Attorney, Agent, or Firm — Marger Johnson

(57) ABSTRACT

A high power, high current Unidirectional Transient Voltage Suppressor, formed on SiC starting material is disclosed. The device is structured to avalanche uniformly across the entire central part (active area) such that very high currents can flow while the device is reversely biased. Forcing the device to avalanche uniformly across designated areas is achieved in different ways but consistently in concept, by creating high electric fields where the device is supposed to avalanche (namely the active area) and by relaxing the electric field across the edge of the structure (namely in the termination), which in all embodiments meets the conditions for an increased reliability under harsh environments.

16 Claims, 14 Drawing Sheets

(56) References Cited

OTHER PUBLICATIONS

Compound Semiconductor News, GE Researchers Develop 250degC+ SiC Transient Voltage Suppressor, Silicon Semiconductor News, Aug. 19, 2014, pp. 1-4, downloaded from the internet Feb. 12, 2015.

Clark, Mel and Walkers, Kent, What is a Silicon Transient Voltage Suppressor . . . and how does it work?, MicroNotes, Series 103, Corporate Applications Engineering Department, Microsemi Corporation, Scottsdale, Arizona, Created May 15, 1997, 2 pages.

Cooper Bussmann, "Transient Voltage Suppression Diode Application Notes," Cooper Bussmann, St. Louis, MO, 2009, two pages \* cited by examiner

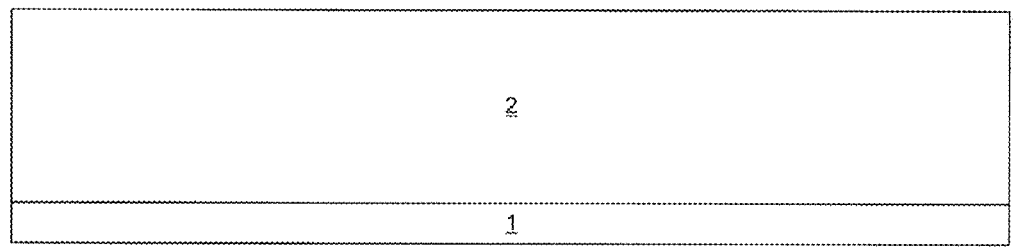
FIG. 1.1
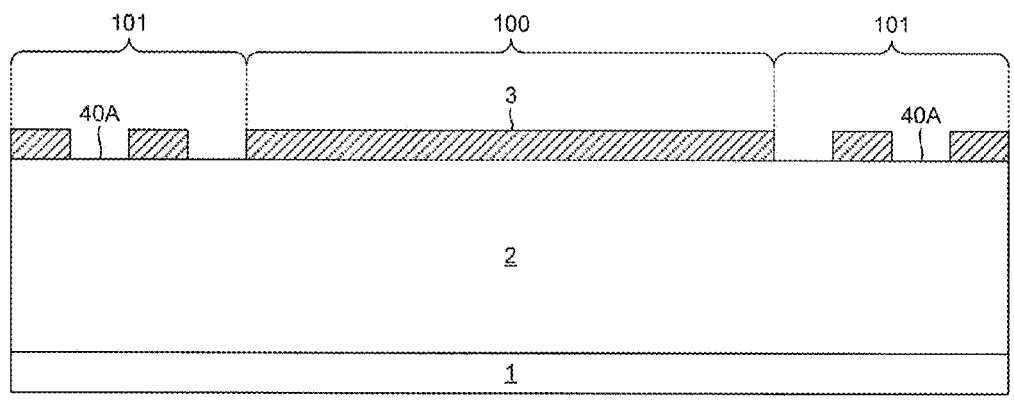
FIG. 1.2
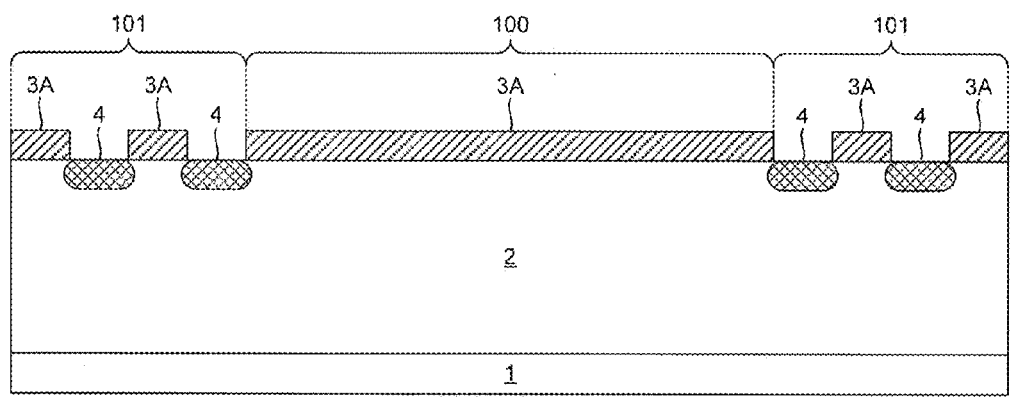
FIG. 1.3

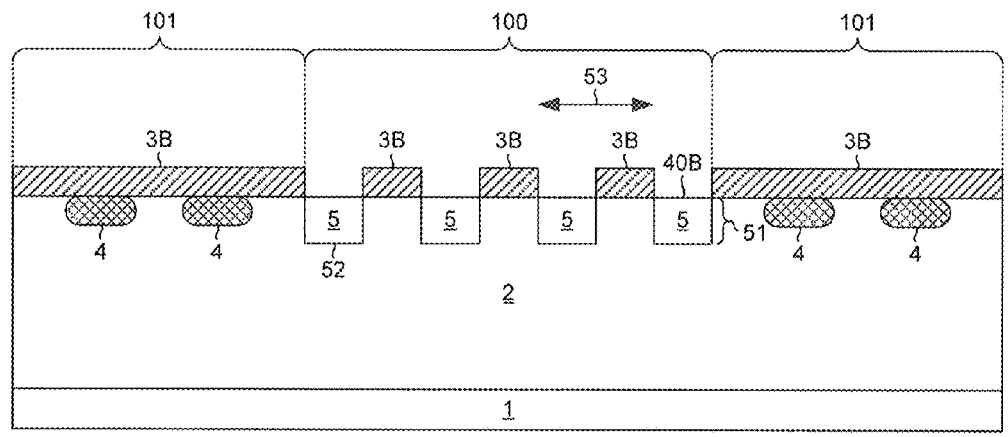
FIG. 1.4
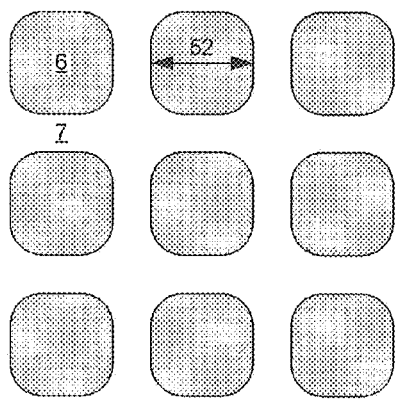
FIG. 1.5
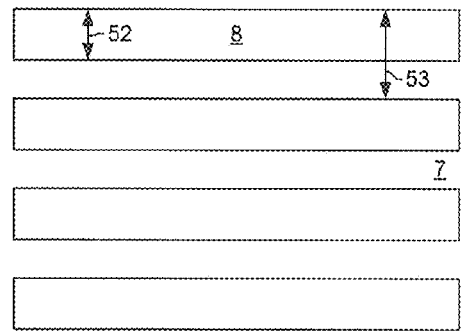
FIG. 1.6

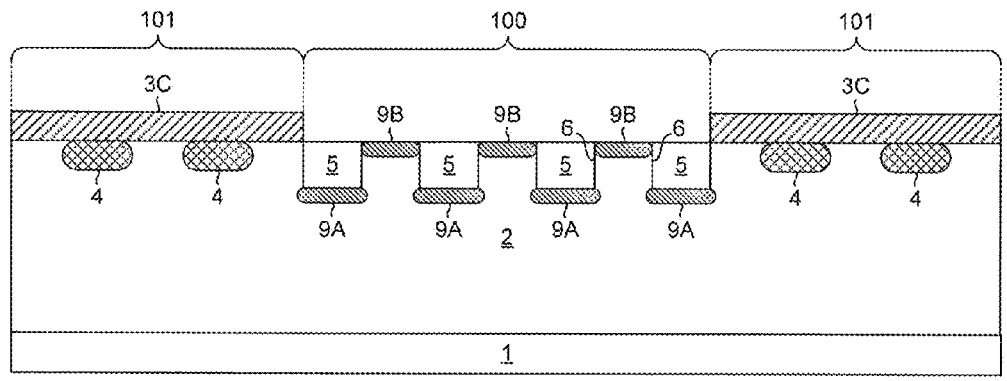
FIG. 1.7
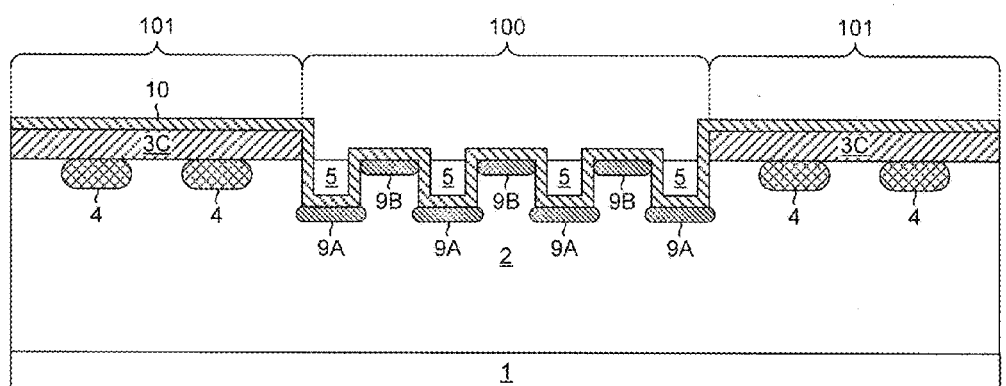
FIG. 1.8
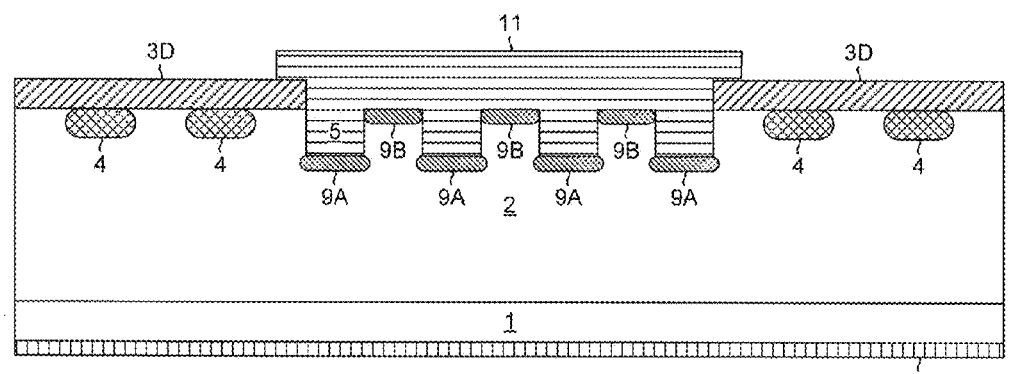
FIG. 1.9

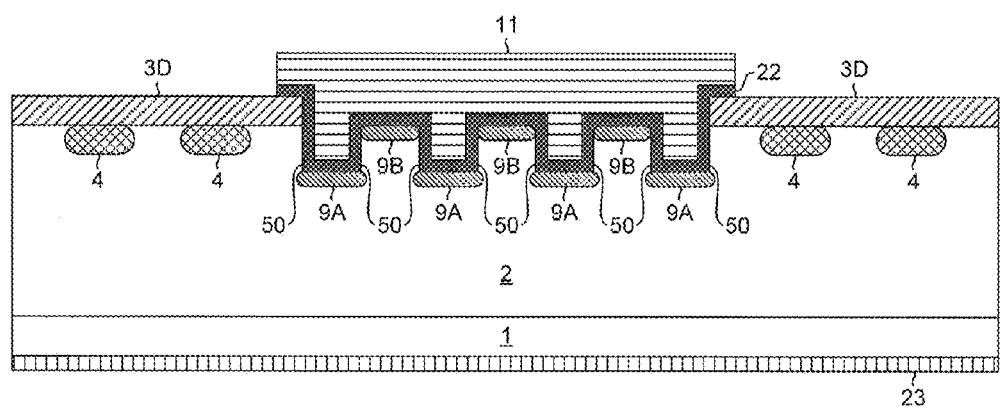
FIG. 1.10
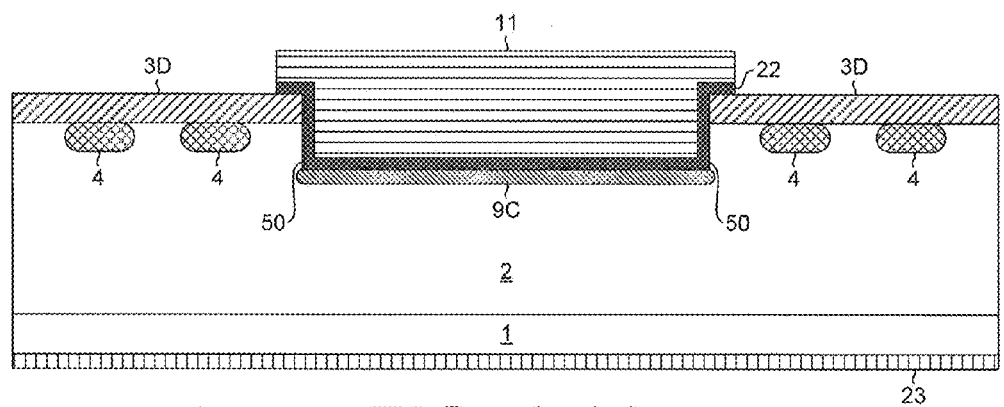
FIG. 1.11

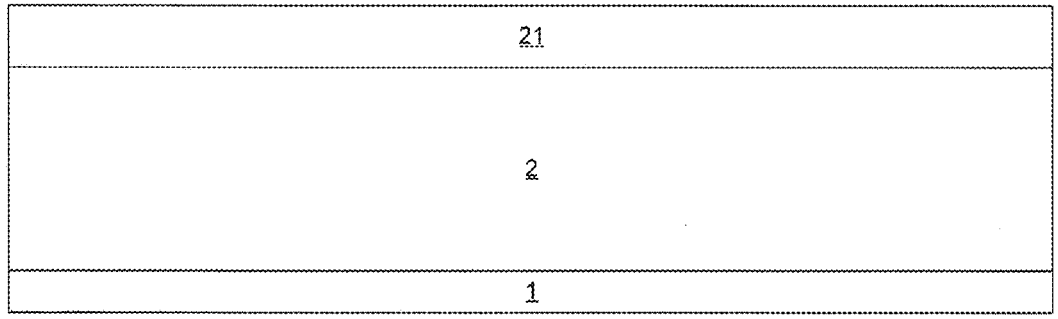
FIG. 2.1
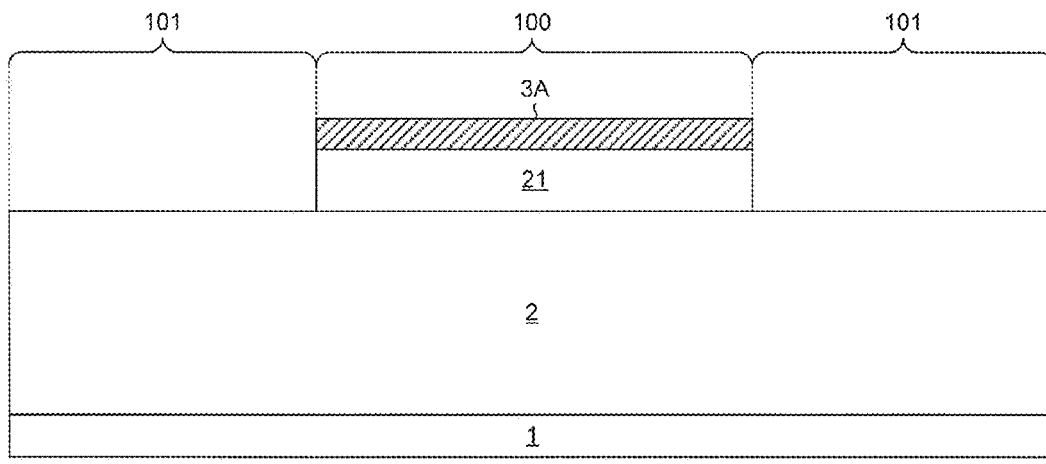
FIG. 2.2
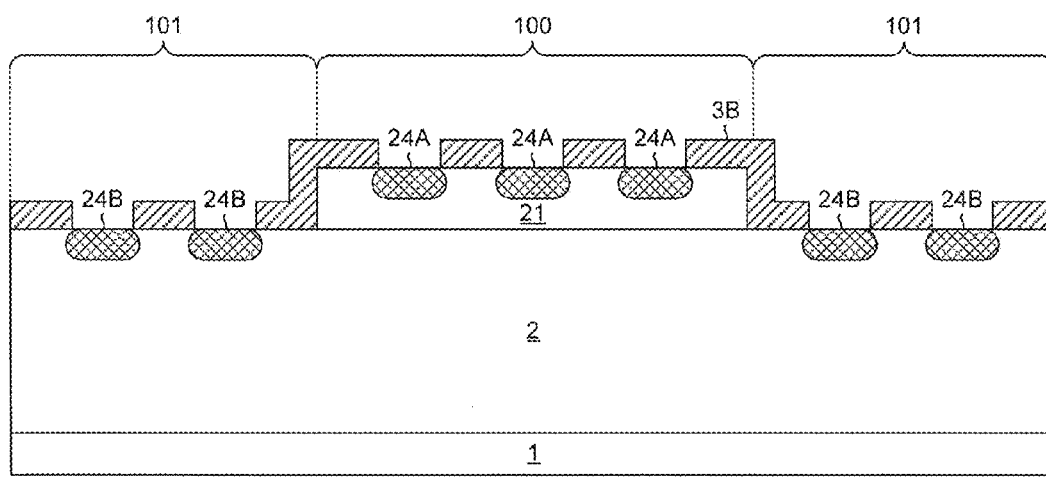
FIG. 2.3

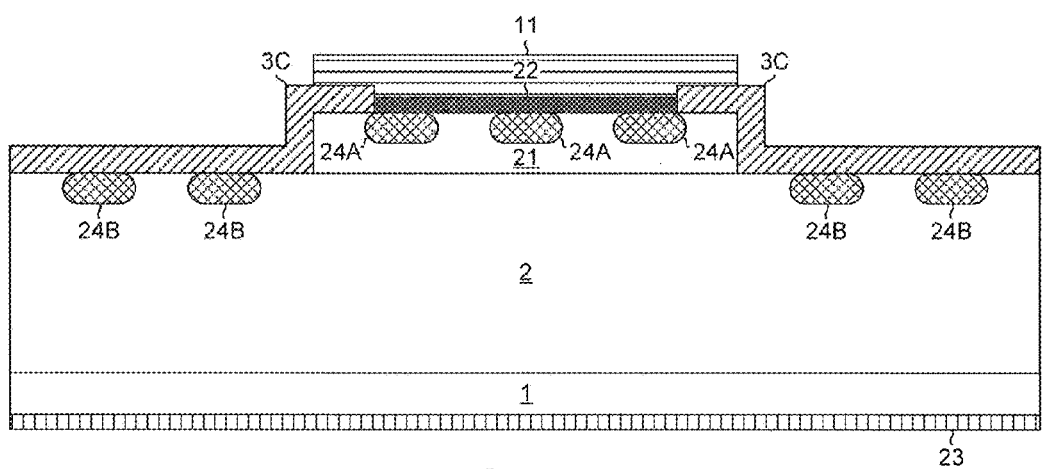
FIG. 2.4

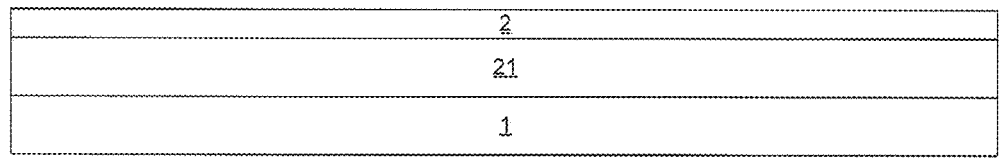
FIG. 3.1
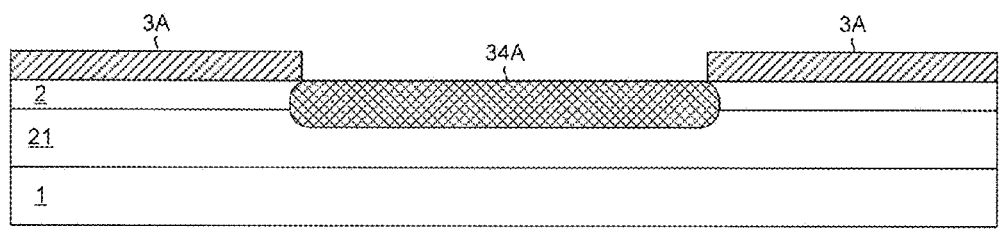
FIG. 3.2
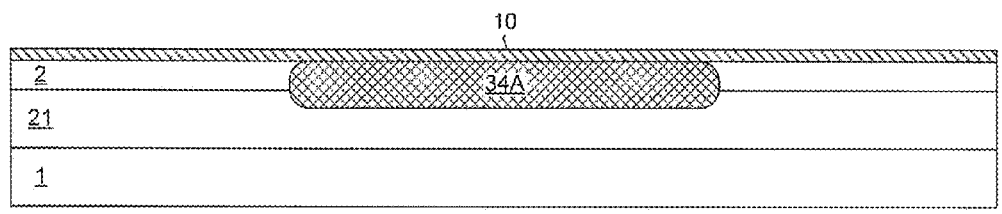
FIG. 3.3
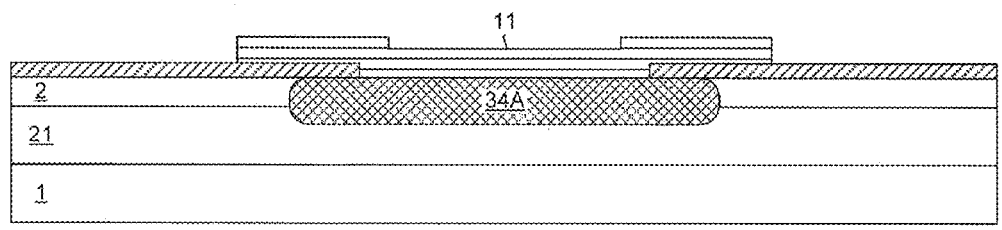
FIG. 3.4

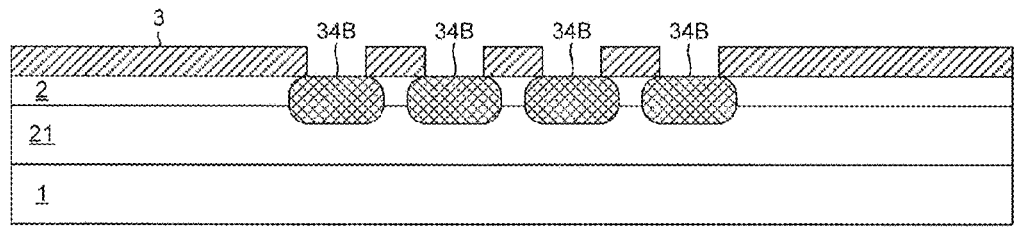
FIG. 3.5
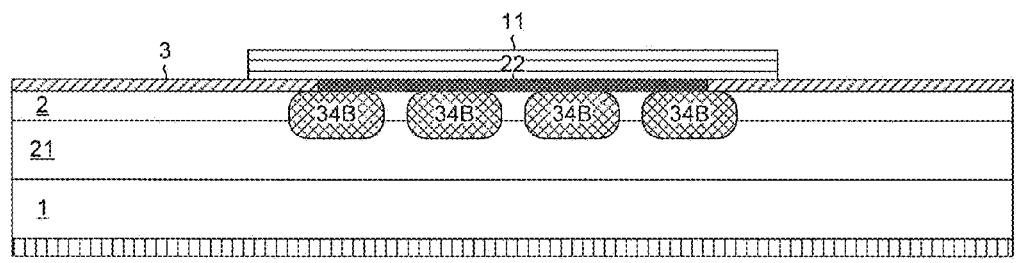
FIG. 3.6
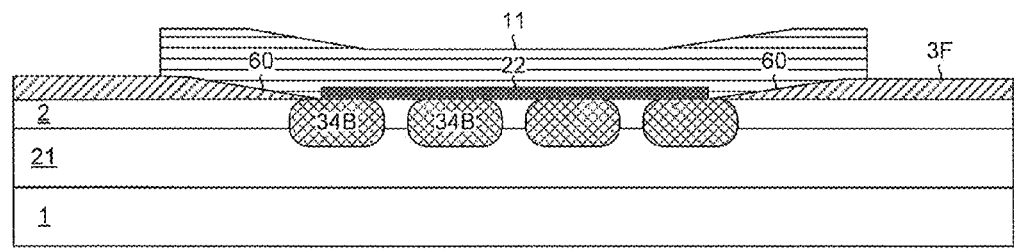
FIG. 3.7

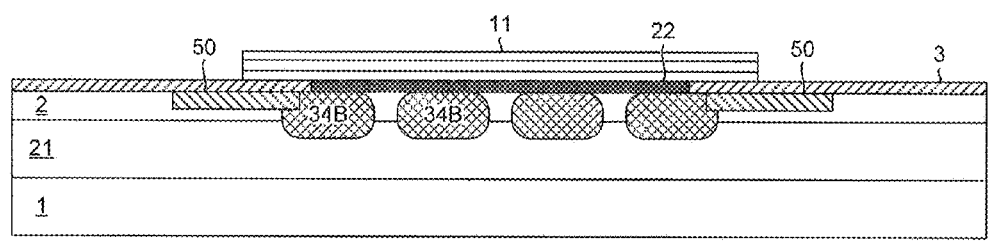
FIG. 3.8

SIC TRANSIENT VOLTAGE SUPPRESSOR

CROSS REFERENCE TO RELATED APPLICATION

This application claims the benefit of copending U.S. provisional patent application 61/939,286, filed Feb. 13, 2014, incorporated by reference herein.

BACKGROUND OF THE INVENTION

The main circuit function performed by a Transient Voltage Suppressor (TVS) is to protect the active elements of the circuit from unexpected transient voltage spikes. These sudden and unexpected transient voltage spikes can be generated by natural causes (lightning being the most common one) or by other high power equipments, operating in close proximity to the sensitive electronic circuit.

The TVS function can be achieved with various devices, most common ones being Metal Oxide Varistors (MOVs), Zener or P-N Junctions operating in avalanche (Semiconductor Avalanche Diodes, or SADs) and by Crowbar Elements (like Gas Discharge).

TVS devices can be made to block (clamp) voltage in one direction (one polarity of the applied voltage) and in this case they are called "unidirectional TVSs" or they can block (clamp) voltages of both polarities ("bi-directional" TVS).

A TVS element, connected in parallel to the circuit to be protected and having a set voltage at which the voltage across the TVS does not increase any further, regardless of how much current flows through it, is the ideal device to ensure continuous operation of the electronic circuit. FIG. 4 illustrates in a very generic circuit the electrical function performed by a TVS to "clamp" the voltage spike induced accidentally by an outside voltage source by "clipping" it to the rated voltage of the TVS. A "transient current" starts to flow through the TVS, the magnitude of this current being determined by the difference between the peak voltage spike and the rating voltage of the TVS divided by the "avalanche series resistance" of the TVS. It becomes apparent to a skilled person that a low series resistance will keep the clamp voltage constant during the current decay, a feature of great importance, but at the same time the power and temperature stress applied to the TVS will be very high in the case of a low series resistance.

Material properties of SiC, like wide band-gap, high electric field, high saturated drift velocity and high thermal conductivity, strongly recommend SiC for power devices. However, a need exists for a suitable structure for implementation of a TVS device in SiC.

SUMMARY OF THE INVENTION

A plurality of improved TVS designs, utilizing the advantages of SiC are enabled herein.

As one can see in the implementations described below, the general design idea is to "force" the avalanche to take place in the active area of the device. By creating the conditions such that the electric field in the termination is significantly lower (and therefore the breakdown in the termination will take place at significantly higher reverse biases) a uniform avalanche will take place over the active area. This means that the current density while in avalanche is low (or in other words high currents can be handled by the device while in avalanche), the series resistance in avalanche will be very low, and the thermal response of the part will be good (i.e. a uniform temperature distribution will be experienced across the entire device).

TVS devices are used in many harsh environments, like avionics and space applications or under extremely high temperature conditions, like electronics for deep hole drilling. Embodiments of this patent are explicitly aimed to make the TVS parts able to withstand and perform their function even under the most stringent stresses specific to these environments.

For space applications, a radiation-hardened TVS is mandatory to be used. During heavy ion bombardment a high charge is created and under high electric field that charge can easily multiply and the power conditions (and therefore the temperature) will bring the device into destruction. One of the embodiments of this patent, the graded epi, creates a low electric field across the entire structure, even under the conditions of high current flowing through the device.

Unless otherwise specified throughout the entire text of this disclosure, we will refer to unidirectional TVS structures as this is an object of this invention.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIGS. 1.1 to 1.11 are cross sections depicting a simplified process flow of an Active Area Trench TVS, according to a first embodiment.

FIGS. 1.5 and 1.6 are top plan views of two versions of the active area patterning.

FIGS. 2.1 to 2.4 are cross sections of a simplified process flow of a Termination Trench TVS, according to a second embodiment.

FIGS. 3.1 to 3.8 are cross sections of a simplified process of a process flow of a planar Low Voltage TVS, according to a third embodiment.

DETAILED DESCRIPTION

Figure 4:
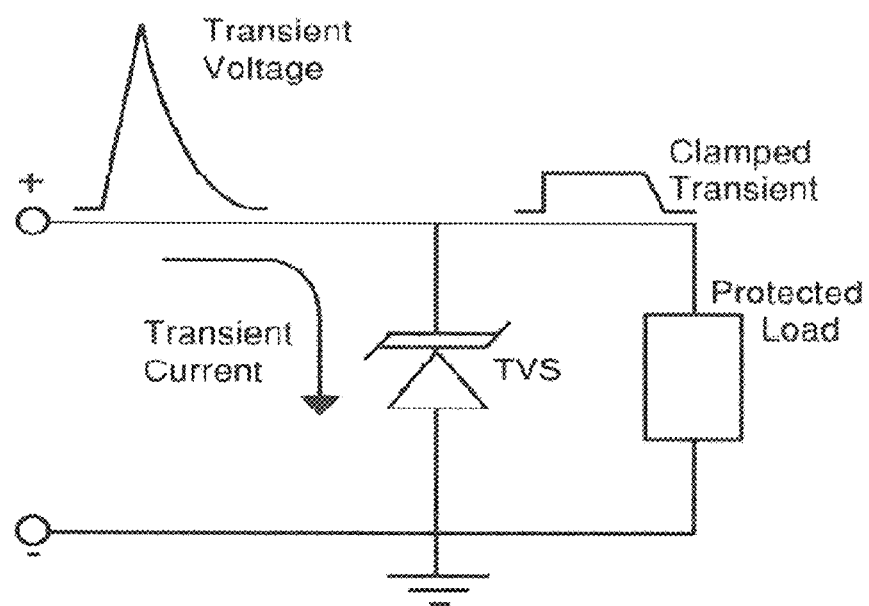
FIG. 4 illustrates a generic circuit diagram of a protection circuit using an unidirectional TVS device.

The main aspects of this invention will be now described with reference to the accompanying drawings that illustrate various embodiments of this concept.

The cross-sections presented in the drawings are of general nature and the aspect ratios of various layers are not to scale. More so, for those skilled in the art, the depositions, etches and interfaces between different layers are done using standard processes in the semiconductor industry. Many customary intermediate process steps in the fabrication of a SiC TVS are omitted as they do not bring any significant contribution to the teaching of this invention.

Targeted clamping voltage of the TVS determines the type of design. We consider three clamping voltage ranges addressed in different ways in this patent. Table 1 defines the main clamp voltage ranges covered by the embodiments described in this disclosure.

TABLE 1

| TVS Type | Voltage Range | Main Feature | Comments |
| --- | --- | --- | --- |
| Planar, LV | <100 V | High Peak Pulse | Extreme environments |
| Active Area Trench | 500-1000 V | Reduced Size | Replaces "stacked Si dies |
| Termination Trench | 100-500 V | Reduced Size | Extreme environments |

The main design goal in the case of a TVS is to ensure that most of the available semiconductor die operates uniformly under avalanche conditions. Any type of P-N junction has an "active area" and a "termination". Active area takes most of the die while the termination, placed around the edge of the P-N junction, occupies a significantly smaller part of the die. If, by improper design or by the changing in the environment, the device starts to avalanche in the termination, then avalanche current of the part will be limited as avalanching in the termination will rapidly exceed the maximum thermal conditions for the part to fail.

Figure 7:
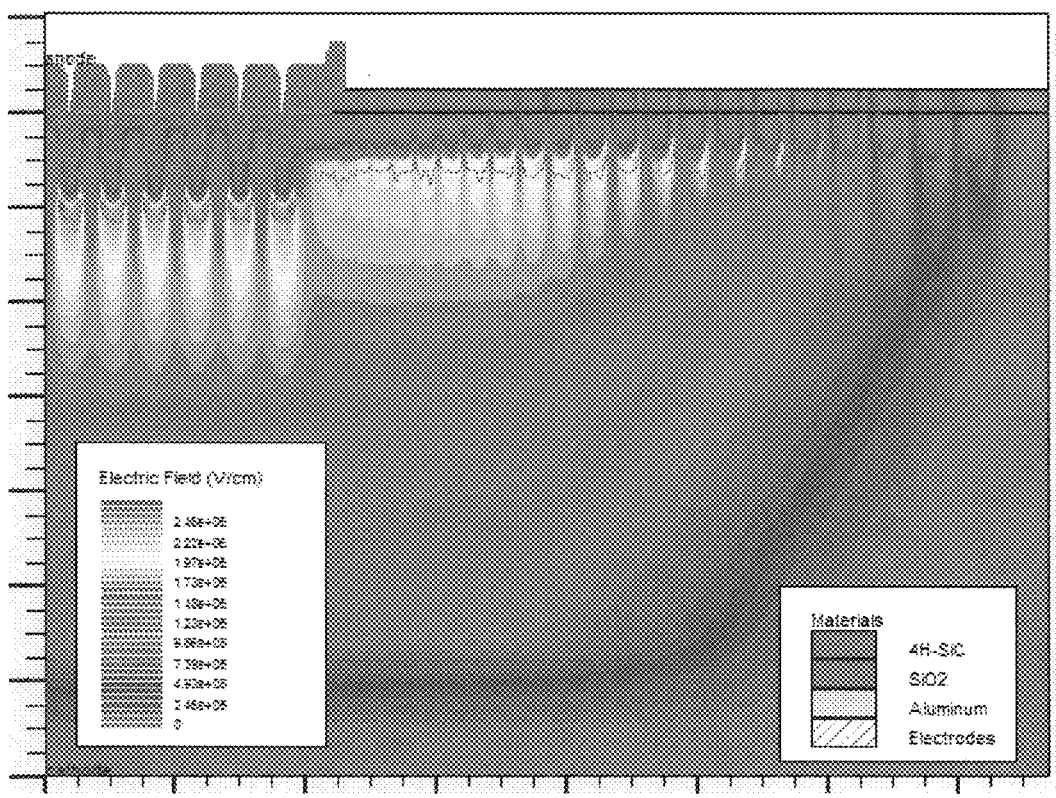
FIG. 7 shows a simulation like FIG. 6 of the electric field at avalanche.
Figure 8:
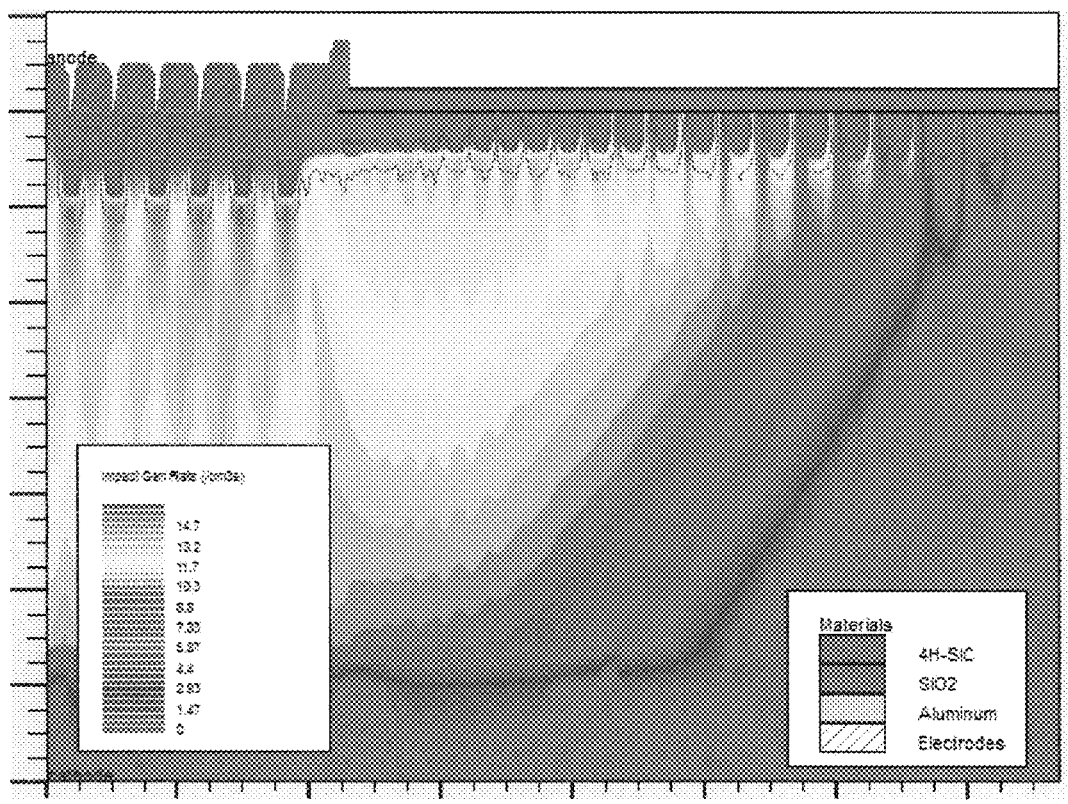
FIG. 8 shows the impact ionization rate in the structure of FIG. 6.

It is therefore highly desirable to design a TVS where the avalanche takes place in the active area under all conditions. In the case of semiconductor devices, this translates into lower (relaxed) electric fields in the termination. Device simulation results shown in FIGS. 6, 7 and 8 demonstrate important aspects of the invention.

Figure 6:
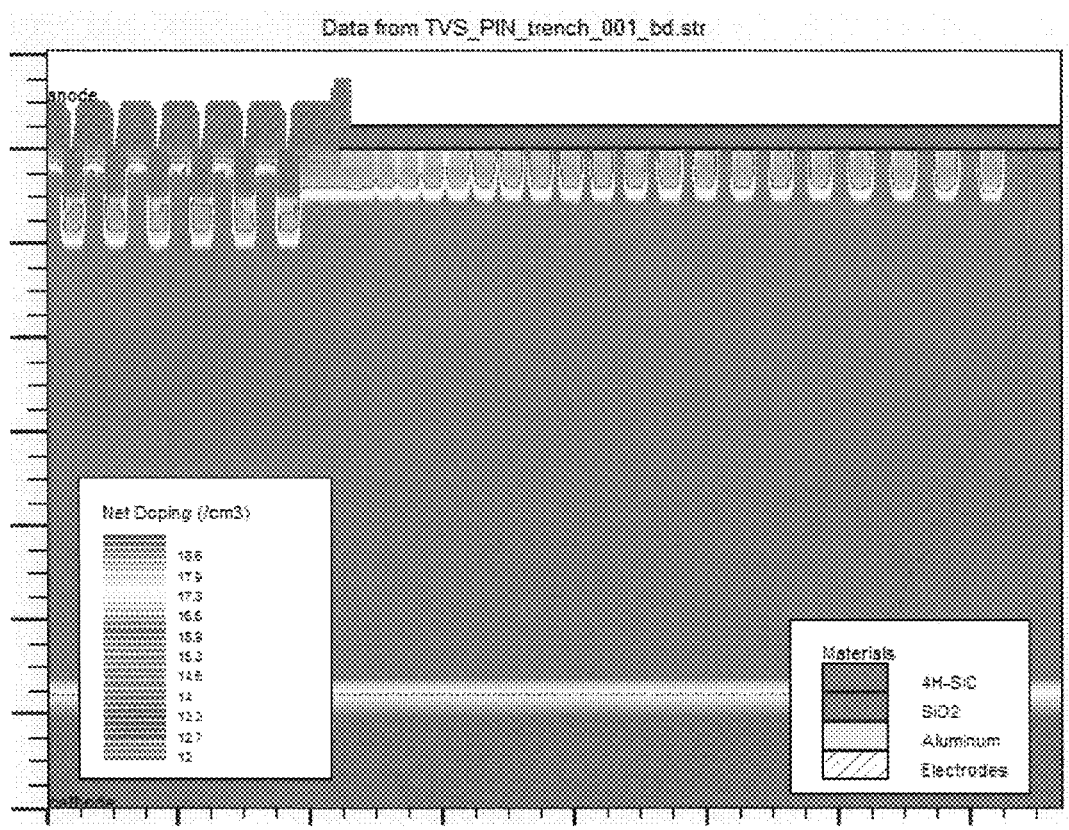
FIG. 6 shows a TCAD simulation structure for the Active Area Trench TVS.

FIG. 6 shows a cross section through one embodiment of the TVS structure (namely the Active Area Trench TVS). Vertical and horizontal axes are arbitrary units and are not limiting the scope of this invention.

P-type regions are formed in the active area of the part (left side of the cross section), at the bottom of the trenches and in the termination, where annular rings are placed toward the edge of the die.

For persons skilled in this field, it is apparent that under reverse bias (FIG. 7) high electric field spots are created at the bottoms of the trenches while the termination is under significantly lower electric field. Impact ionization rate under the same reverse bias conditions, plotted in FIG. 8, also indicates that the entire avalanche current will take place at the bottoms of the Active Area Trenches. This is true at the beginning of the avalanche process, which has a positive temperature coefficient. Therefore, as the temperature at the bottoms of the trenches goes up the voltage required to sustain the avalanche also increases, and soon enough the entire active area is under avalanche conditions.

The teachings of all three implementations of these SiC TVS patent are based on the fundamental requirement to create a significant difference in the avalanche conditions of the termination region (higher breakdown in the termination) and of the active area (lower breakdown by a significant margin in the active area).

Process Flow of an Active Area Trench SiC TVS

In the first embodiment, as seen in FIG. 1.9 or 1.10, a higher voltage TVS is targeted (e.g., targeted voltage 500-800V). In this case, the active area avalanche is forced to take place by the depth and the placement (layout design) of the trenches 5 in the SiC material. The top part of the structure and the bottom of the trenches are implanted with Aluminum, forming a P-type doping 9, and therefore a P-N junction. In some embodiments, such as FIG. 1.10, the sides of the trenches are set with proper Schottky barrier metals to create a Schottky barrier diode 50 on the side walls of the trenches, and in this way the forward voltage of the TVS is even lower, a very advantageous feature of the final device.

The depth and the placement of the trenches create high electric fields at the bottom (and the corners) of the trenches, and therefore the first avalanche of the TVS will take place at those locations. Since the breakdown voltage has a positive temperature coefficient, the avalanche will spread easily across the entire active area, while across the termination (i.e., the exterior edge of the structure) low electric field conditions continue to exist and the termination will never be brought into avalanche.

FIG. 1.1 is a cross section of the starting material to be used to make a SiC TVS where the sustaining voltage (clamping voltage) is "forced" to take place in the center part of the device, named from now on the "active area" 100, to differentiate it from the edge region of the die, named from now on the "termination" 101.

On a heavily doped SiC substrate 1 (e.g., range: 1E18 to 1E19/cm3) an epitaxial doped layer 2 (e.g., range: 1E15 to 1E17/cm3) is grown, with the proper thickness and doping designed for a given target of the blocking voltage in the termination 101. SiC material can be of any polytype (2H—SiC, 4H—SiC, 6H—SiC, 3C—SiC and so on) but from now on we will assume that the starting material is the 4H—SiC polytype.

Figure 5:
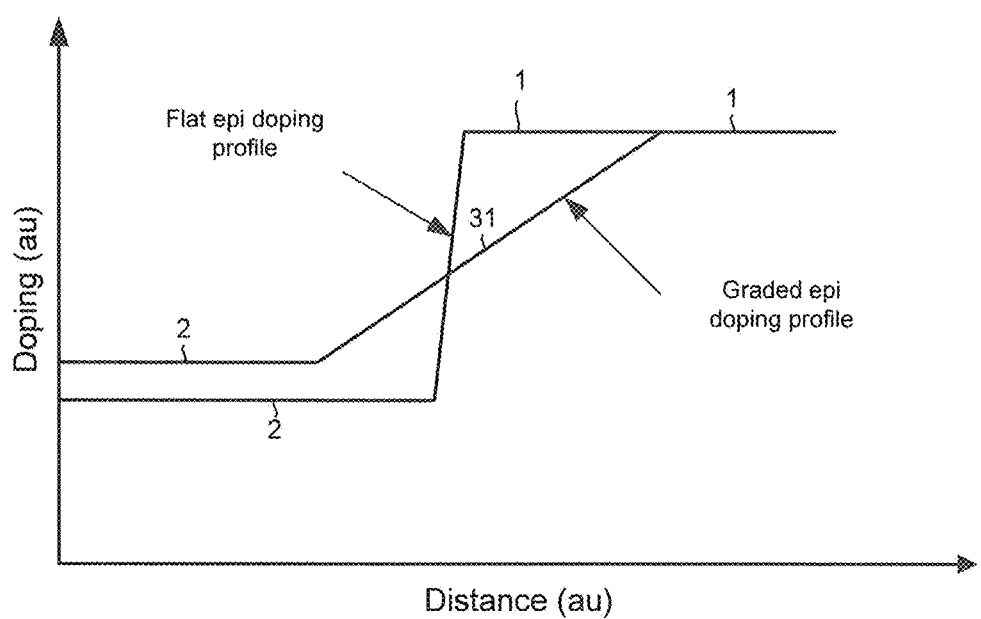
FIG. 5 illustrates an example starting material for an SiC substrate comparing a graded doping epitaxial layer and a flat epitaxial doping profile.

The doping of the substrate and the epitaxial layer can be of first type (N-type doping) or of the second type (P-type doping). For the rest of this text the starting material is assumed to be of the first type (N-type) even though the entire concept of this invention is applicable regardless of the type of doping of the starting material. The doping profile of the epitaxial layer 2 can be "flat" (no doping variation of the epitaxial layer throughout its entire thickness) or, preferably, doping can be "graded" depthwise, as illustrated in FIG. 5.

A graded epi profile consists of a 4H—SiC substrate 1, on which an epitaxial layer with variable doping profile 31 is grown, where the doping concentration of the graded epitaxial layer is higher toward the substrate 1 and levels off to the doping of the second epitaxial layer 2.

The doping and the slope of the first epitaxial layer 31 and the doping of the second layer 2 should be carefully designed and optimized for the desired rating voltage of the device and for this highest current capability while the part is in avalanche.

A shallower slope of epitaxial layer 31 improves the current capability of the TVS and can also "block voltage.". By optimizing the gradient of layer 31, the doping of the epitaxial layer 2 can be increased and its thickness can be decreased, and in this way a trade-off can be achieved between the reverse and forward voltage properties (and the cost) of the TVS.

Of course a "flat" epi doping profile, as depicted in FIG. 5, can be used to make a TVS, with the thickness and the doping of the flat region 2 of the epitaxial wafers tailored for the desired breakdown voltage of the device.

The Breakdown Voltage (BV) in the termination area 101 is higher than the BV of the active area 100, preferably at least two times higher, regardless of the rating voltage of the TVS. In this way, under the most stringent current conditions, the termination will always be free of avalanche current, ensuring long term reliability of the part.

A description of the process flow is provided for the Active Area Trenched TVS. To the skilled person the same process steps can be adapted to make a Termination Trench TVS or a Low Voltage TVS and therefore the process flow for the last two types of TVS structures will not be repeated in as much detail.

At FIG. 1.2, a layer of oxide, 3A, of proper thickness, is deposited, photo masked and etched to create windows 40 in the termination area 101. The spacing and the number of windows are very specific to the rating voltage of the device and their optimization is performed using advanced TCAD (Technology Computer Aided Design) tools. Examples of simulation results for this type of structure are presented (for illustration only) in FIGS. 6, 7 and 8. The goal of the design is to achieve the highest breakdown voltage for a given doping of the epitaxial layer 2 using the smallest possible termination area 101 such that the allocated area 100 of the active part of the device is the largest possible.

Through these windows 40A, at FIG. 1.3, Aluminum or Boron ions are implanted with dose and energy tailored for the highest possible breakdown. Aluminum or Boron are the preferred species to create a layer of the second type (P-type) in the designed regions 4 of the termination. For practical purposes from now on all layers of the second type doping will be considered to have been implanted with Aluminum. Heated Al implants are highly recommended in the case of SiC wafers to prevent complete amorphization of the implanted layers and thereby enable maximum activation of implanted ions.

After a couple of intermediate process steps like oxide strip and wafer cleaning, at FIG. 1.4, fresh oxide 3B is deposited on the wafers, photo masked with proper pattern and etched to expose the surface of the SiC through oxide windows 40B, this time created in the active area 100 of the device. The pattern of these windows 40B is left at the imagination and skill of the designer, but they can be of cellular design, as illustrated in FIG. 1.5 or of stripe design as in FIG. 1.6. The width 6 of the cells design or the width 8 or the stripes, and the spacing 7 between the windows are relevant to this invention in the sense that a high density of the windows in the oxide is desirable for current capability of the device while in avalanche.

Using a dry etch process, the top side of the SiC wafer is etched through the windows 40B to create the trenches 5, defined by a depth 51 in FIG. 1.4, and a width 52 and a pitch 53 in FIG. 1.5 or 1.6. The depth of the trenches has a strong impact on the avalanche voltage of the device. The deeper the trenches 5, the lower the blocking voltage of the part will be, while the avalanche of the termination remains virtually the same. The depth of the trenches 51 is the defining parameter of the structure which creates the gap between the active area avalanche of the TVS and the blocking voltage of the termination. The width 52 of the trench should be made as wide as is acceptable for the processing tools available in the line, as most if not the entire avalanche current will flow through the bottom of the trench.

Another photo step is done on a freshly deposited oxide 3C (FIG. 1.7) that opens the active area 100 of the device, such that Aluminum can be implanted with the proper dose and energy across the entire exposed surface of the wafer. The implanted regions 9A, 9B change the doping of the starting material from N-type to P-type, forming P-N junctions subjacent the bottoms of the trenches and the exposed upper surfaces of the SiC wafer between the trenches. The structure in the active area of the device is complex in the sense that vertically spaced apart P-N junctions are formed along the horizontal surfaces of the device while on the vertical walls 6 of the trenches 5 bare SiC surfaces are exposed and available to create a Schottky Barrier Diode on the sides of the trenches. Implant doses in the range of 1E14/cm2 and 2E15/cm2 are normally used for these implants, and the energy levels are typically in the range of 50 KeV to 200 KeV. Doses and energies outside of the ranges given in this patent should be also be considered part of this patent as multiple implants of various doses and energies can be used to create a "box" like type layer for improved electrical performances (P-type or N-type implants, depending on the implanted species).

Even though the Active Area TVS structure performs all the required functions (it clamps voltage to the prescribed value under reverse bias and has a forward bias voltage according to a P-N diode) forming a Schottky Barrier Diode on vertical walls of the trenches creates a TVS with superior performances.

A Carbon layer 10 is deposited on the wafer (FIG. 1.8) and a high temperature anneal process, performed to activate the implanted layers in the active area 100 and in the termination 101. The high temperature anneal step is usually done at temperatures in the range 1600-2000 C in an inert atmosphere for extended period of times (from minutes to a couple of hours).

Following the high temperature anneal step, at FIG. 1.9 the Carbon layer 10 is stripped off, wafers are cleaned, a Passivation oxide 3D is deposited, photo-masked and etched to expose the active area 100 and front side metals 11 are sputtered (or evaporated) on the wafers. Front side metals can be either Aluminum based, for a standard die attach and wire-bonding packaging approach, or any type of soft solder front side metals (Pb, Ag, or Au based) with the customary barrier metals 22 (FIG. 1.10) between the front metal 11 and the SiC surface. The barrier metals can be Ti, TiW, TiN or WC, and in this case a Schottky Barrier Diode 50 is formed on the vertical walls of the trenches.

To complete the fabrication of the SiC TVS, a front side Passivation layer can be deposited and etched to expose the bonding pads (not shown here) and an ohmic contact and backside metal 23 are formed on the backside of the wafers.

FIG. 1.11 shows a simpler version of the active area trench SiC TVS. This version is simpler and still achieves a high clamping voltage but at some sacrifice of forward conduction and avalanche efficiency compared to the FIG. 1.10 version. In FIG. 1.11, the trench and the doped region 9C implanted in the bottom of the trench extend the full width of the central active area. As in the 1.10 version, the trench recesses the doped region 9C below the implants 4 that form the termination rings, thereby inducing avalanche in the central active area before avalanche conditions are reached in the peripheral termination area.

Process Flow of a Trench Termination TVS

In a second embodiment, as seen in FIG. 2.4, a mid-range voltage TVS is enabled (100-500V range). In order to induce an active area avalanche, a heavier doping of the epitaxial layer is employed towards the anode region. The heavier doping at the top surface of the wafers can be easily achieved during the epitaxial process where a first epitaxial layer 2 (grown right on the top of the substrate) has a doping in the example range of 1E15 to 8E15 atoms/cm3 while a top epitaxial layer 21 (grown sequentially after the growth of the first layer was completed) can have a doping in the example range of 2E16 to 1E17 atoms/cm3. The targeted breakdown voltage is 30-100V which is tailored by the doping of the top epitaxial layer 21. TCAD simulations or analytical or experimental data can provide the data required to make the design of the doping of the second epitaxial layer for the desired BV of the product. A high voltage termination in the form of floating P-rings 24B are formed in a recessed area, to take full advantage of the higher resistivity of the first epitaxial layer.

In particular, the parameters of the top epitaxial layer (N+) doping and thickness defines the voltage rating of the TVS, while the epi parameters of 1st epitaxial layer (the drift region 2), defines the blocking voltage of the termination. The cellular, or stripe design, represented in each of FIG. 1.5 and FIG. 1.6, by small rectangles underneath the front metal or at the bottom of the trench, creates conditions for "active area", avalanche, i.e., it forces the avalanche to occur at the edge of the cells, an avalanche that will spread over the entire active area. The top structure 22 is very similar to Schottky Barrier Diodes (SBD) available from Microsemi Corporation, but the epitaxial layers are designed for lower Breakdown Voltage and therefore the forward voltage of the part will be lower. A thick substrate (15 mils or thicker) and a thick heat sink soldered to the top metal will provide the required thermal capacitance of the device. The N-drift region 2 can have a graded doping profile as in FIG. 5, with greater doping concentration towards the anode, which provides an improved low series resistance both in forward mode and when in avalanche.

The process flow of the Trench Termination TVS is very similar to the one disclosed in previous paragraphs. FIGS. 2.1 to 2.4 show the differences.

Starting material in this case consists of a SiC substrate 1 (4H—SiC in our case but this invention is not restricted to the use of this polytype) on which either a "flat" or a "graded" second epitaxial layer 2 is grown, and on which the third epitaxial layer 21 is deposited. The doping and the thickness of the epitaxial layer 21 are chosen to be consistent with the rated voltage of the TVS and, in general terms, its doping (e.g., range: 1E16 to 1E18/cm3) is about one order of magnitude higher than the doping of the first epitaxial layer 2. N-type doping (polarity) of all three layers (substrate, first epitaxial layer and second epitaxial layer) is described here but the opposite type of polarity (P-type) can also be used without conceptually limiting the application of this invention.

To increase the blocking voltage of the termination, the heavily doped layer 21 is removed at the edge of the die (in the termination area 101) using a protective oxide 3A, photo-masked and etched to create conditions for a trench 5 to be formed around the active area 100.

Using oxide layer 3B as a mask, implanted regions 24A, 24B are created in the active area 100 and in the termination 101.

A person skilled in the art will see that the P-type islands 24A in the active area form P-N junctions in the heavily doped epitaxial layer 21 and therefore their blocking voltage is much lower than the P-N junctions formed by islands 24B in the termination, where the doping of the epitaxial layer 2 is just about one order of magnitude lower than the doping of layer 21.

Active area pattern can be cells or stripes, as described in the process flow of the Active Area Trench TVS (FIG. 1.5 or 1.6), or the entire active area can be implanted to form a continuous P-type region. On the other hand, traditional annular rings, with proper spacing and widths, can be used to form the high voltage termination.

The Termination Trench TVS structure is completed by performing previously described process steps, like Carbon coating, high temperature anneal, oxide deposition and etch, front side metals (including barrier metals), passivation deposition and etch and backside metal.

FIG. 2.4 illustrates a cross-section through a Termination Trench TVS in the final phased of processing.

Process Flow of a Planar Low Voltage TVS

In another embodiment, a fully planar low voltage TVS structure is disclosed. FIGS. 3.1 to 3.8 show this embodiment of the process and resultant device structure.

Starting material is a 4H—SiC heavily doped substrate 1 (N-type, or first conductivity) on which one epitaxial layer 21 is grown (N-type), as a relatively thin layer and also heavily doped (e.g., range: 1E17 to 5E18/cm3; for example, Nd approx 1-5E17/cm3). Layer 21 is the one defining the rating voltage of the TVS, and on the top of it another epitaxial layer 2 is grown, its doping (e.g., range: 1E15 to 1E17/cm3) being substantially lower than the doping of layer 21. Layer 2, together with the choice of termination (field plate, JTE, tapered field oxide, or a combination of all or more) has all the conditions to avalanche at a significantly higher reverse voltage. In this way, the conditions of the device to uniformly avalanche in the active area are met.

The process flow largely resembles the previously-described process flows: oxide depositions, patterning, etch, P-type implants with proper masks, Carbon deposition and high temperature anneal, front side metal II with or without barrier metals 22, passivation and backside metals 23.

One difference is that this embodiment is planar, not using trenches to position the active area and termination implants at different depths relative to the graded dopings of the first and second embodiments.

In this embodiment, an important condition of the implanted P-type layers 34A, 34B is that the projected range of the implant should be at (or close to) the transition region between layer 21 and layer 2. In this way, the high electric field conditions at the bottom of the P-type anode(s) 34A, 34B are satisfied and the TVS will always conduct current throughout the entire active area while in avalanche.

TCAD simulations can easily find the optimum conditions of this implant, in relationship to the thickness of layer 2. For example, a layer 2 with a thickness of about 1.5 um and a doping of about 1E15/cm3 can be "matched" with an Aluminum implant of the dose in the range of 1E14/cm2 to 2E15/cm2 and an implant energy in the range of 300 KeV to 400 KeV (double ionized implants can also be used for this implants).

FIGS. 3.1 to 3.4 form the active area as a single contiguous implant 34A. FIGS. 3.5 to 3.8 form the active area implants 34B as multiple cells or strips as in the first and second embodiments. Barrier layer 22 can also be used as described above.

In one version of this embodiment shown in FIG. 3.7, a planar high voltage termination employing a "tapered Field oxide" 3F, 60 is used to enhance the blocking voltage in the termination. In another version of this embodiment shown in FIG. 3.8, a Junction Termination Extension 50 is used to increase the avalanche voltage of the termination.

In another embodiment, front metal is extended over the lightly doped epitaxial layer 2, forming a field plate that creates conditions for a high blocking voltage in the termination region.

Having described and illustrated the principles of the invention in a preferred embodiment thereof, it should be apparent that the invention can be modified in arrangement and detail without departing from such principles. We claim all modifications and variation coming within the spirit and scope of the following claims.

The invention claimed is:

1. A transient voltage suppressor, comprising:
   a silicon carbide (SiC) substrate of a first dopant type and a first doping concentration;
   a backside conductive contact on a backside of the substrate;
   an epitaxial SiC layer of the first dopant type and a second doping concentration less than the first doping concentration on the substrate;
   a central active area including one or more regions of a second dopant type opposite the first dopant type forming a PN junction in the epitaxial layer;
   a frontside conductive contact on an upper side of the epitaxial SiC layer coupled to the one or more regions of the second dopant type; and
   a peripheral termination area surrounding the central active area and including a termination structure arranged to suppress electric field and avalanche around the central contact area;
   the central active area being structured to avalanche within the active area under a voltage condition applied across the conductive contacts that exceeds a predetermined breakdown voltage in the central active area that is less than a breakdown voltage of the peripheral termination area;
   in which:
   the epitaxial SiC layer has an upper surface;
   the central active area includes an array of spaced-apart trenches each having a bottom spaced below the upper surface with first implants of the second dopant type in the bottom of each trench; and
   the peripheral termination area includes an array of second implants of the second dopant type subjacent the upper surface of the epitaxial SiC layer;
   the first implants extending to a depth in the epitaxial SiC layer greater than a depth of the second implants so as to thereby provide the lower breakdown voltage in the central active area than a breakdown voltage in the peripheral termination area.

2. A transient voltage suppressor according to claim 1 capable of a clamping voltage greater than 500V.

3. A transient voltage suppressor according to claim 1 capable of a clamping voltage greater than 100V.

4. A transient voltage suppressor according to claim 1 in which the frontside conductive contact includes a Schottky metal layer.

5. A transient voltage suppressor, comprising:
   a silicon carbide (SiC) substrate of a first dopant type and a first doping concentration;
   a backside conductive contact on a backside of the substrate;
   an epitaxial SiC layer of the first dopant type and a second doping concentration less than the first doping concentration on the substrate;
   a central active area including one or more regions of a second dopant type opposite the first dopant type forming a PN junction in the epitaxial layer;
   a frontside conductive contact on an upper side of the epitaxial SiC layer coupled to the one or more regions of the second dopant type; and
   a peripheral termination area surrounding the central active area and including a termination structure arranged to suppress electric field and avalanche around the central contact area;
   the central active area being structured to avalanche within the active area under a voltage condition applied across the conductive contacts that exceeds a predetermined breakdown voltage in the central active area that is less than a breakdown voltage of the peripheral termination area;
   in which:
   the epitaxial SiC layer includes a first epitaxial sublayer of the second doping concentration and a second epitaxial sublayer of a third doping concentration greater than the second doping concentration atop the first epitaxial sublayer, each epitaxial sublayer having an upper surface;
   the central active area being formed subjacent the upper surface of the second epitaxial sublayer and the peripheral termination area being formed subjacent the upper surface of the first epitaxial sublayer.

6. A transient voltage suppressor according to claim 5 in which the frontside conductive contact includes a Schottky metal layer.

7. A transient voltage suppressor, comprising:
   a silicon carbide (SiC) substrate of a first dopant type and a first doping concentration;
   a backside conductive contact on a backside of the substrate;
   an epitaxial SiC layer of the first dopant type and a second doping concentration less than the first doping concentration on the substrate;
   a central active area including one or more regions of a second dopant type opposite the first dopant type forming a PN junction in the epitaxial layer;
   a frontside conductive contact on an upper side of the epitaxial SiC layer coupled to the one or more regions of the second dopant type; and
   a peripheral termination area surrounding the central active area and including a termination structure arranged to suppress electric field and avalanche around the central contact area;
   the central active area being structured to avalanche within the active area under a voltage condition applied across the conductive contacts that exceeds a predetermined breakdown voltage in the central active area that is less than a breakdown voltage of the peripheral termination area;
   in which:
   the epitaxial SiC layer includes a first epitaxial sublayer of the second doping concentration and a second epitaxial sublayer of a third doping concentration between the first epitaxial sublayer and the substrate, the third doping concentration less than the first doping concentration of the substrate and greater than the second doping concentration.

8. A transient voltage suppressor according to claim 7 in which the frontside conductive contact includes a Schottky metal layer.

9. A transient voltage suppressor, comprising:
   a silicon carbide (SiC) substrate of a first dopant type and a first doping concentration;
   a backside conductive contact on a backside of the substrate;
   an epitaxial SiC layer of the first dopant type and a second doping concentration less than the first doping concentration on the substrate;
   a central active area including one or more regions of a second dopant type opposite the first dopant type forming a PN junction in the epitaxial layer;
   a frontside conductive contact on an upper side of the epitaxial SiC layer coupled to the one or more regions of the second dopant type; and a peripheral termination area surrounding the central active area and including a termination structure arranged to suppress electric field and avalanche around the central contact area;

the central active area being structured to avalanche within the active area under a voltage condition applied across the conductive contacts that exceeds a predetermined breakdown voltage in the central active area that is less than a breakdown voltage of the peripheral termination area;

in which the second doping concentration in the epitaxial SiC layer has a graded dopant profile spanning an interface between the substrate and the epitaxial SiC layer.

10. A transient voltage suppressor according to claim 9 in which the frontside conductive contact includes a Schottky metal layer.

11. A transient voltage suppressor, comprising:
a silicon carbide (SiC) substrate of a first dopant type and a first doping concentration;
a backside conductive contact on a backside of the substrate;
an epitaxial SiC layer of the first dopant type and a second doping concentration less than the first doping concentration on the substrate;
a central active area including a region of a second dopant type opposite the first dopant type forming a PN junction in the epitaxial layer;
a frontside conductive contact on an upper side of the epitaxial SiC layer coupled to the region of the second dopant type; and
a peripheral termination area surrounding the central active area and including a termination structure arranged to suppress electric field and avalanche around the central contact area;
the central active area being recessed to form a trench having a bottom spaced below the upper side of the epitaxial SiC layer, the region of second dopant type being located below the bottom of the trench so as to avalanche within the active area under a voltage condition applied across the conductive contacts that exceeds a predetermined threshold voltage.

12. A transient voltage suppressor according to claim 11 in which the termination structure includes termination rings of the second dopant type implanted in the epitaxial SiC layer above the bottom of the trench.

13. A transient voltage suppressor, comprising:
a silicon carbide (SiC) substrate of a first dopant type and a first doping concentration;
a backside conductive contact on a backside of the substrate;
an epitaxial SiC layer of the first dopant type and a second doping concentration less than the first doping concentration on the substrate;
a central active area including multiple cellular or stripe regions of a second dopant type opposite the first dopant type, each forming a PN junction in the epitaxial layer ;
a frontside conductive contact on an upper side of the epitaxial SiC layer coupled to each of the regions of the second dopant type; and
a peripheral termination area surrounding the central active area and including a termination structure arranged to suppress electric field and avalanche around the central contact area;
the central active area being structured as an array of the cellular or stripe regions of the second dopant type formed in bottoms of trenches in the epitaxial SiC layer so as to avalanche within the active area under a voltage condition applied across the conductive contacts that exceeds a predetermined threshold voltage.

14. A transient voltage suppressor according to claim 13 in which second regions of the second dopant type are formed on the upper side of the epitaxial SiC layer between the trenches.

15. A transient voltage suppressor according to claim 14 in which the trenches have side walls between the cellular or stripe regions at the bottoms of the trenches and the second regions, the frontside conductive contact extending over the bottoms of the trenches, the side walls and the upper side of the epitaxial SiC layer between the trenches.

16. A transient voltage suppressor according to claim 15 in which the frontside conductive contact includes a Schottky metal layer.

* * * * *